US012581611B2

(12) United States Patent
Ku et al.

(10) Patent No.: US 12,581,611 B2
(45) Date of Patent: Mar. 17, 2026

(54) METHODS AND APPARATUS TO COOL ELECTRONIC DEVICES

(71) Applicant: Intel Corporation, Santa Clara, CA (US)

(72) Inventors: Jeff Ku, Taipei (TW); Cora Nien, Taipei (TW); Arnab Sen, Bangalore (IN); Samarth Alva, Bangalore (IN); Boon Ping Koh, Seberang Jaya (MY); Min Suet Lim, Gelugor (MY); Arvind S, Bangalore (IN); Lance Lin, Taipei (IN); Prakash Kumar Raju, Bangalore (IN); Shantanu Kulkarni, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 17/848,664

(22) Filed: Jun. 24, 2022

(65) Prior Publication Data

US 2022/0322567 A1　　Oct. 6, 2022

(51) Int. Cl.
　　*H05K 7/20*　　　(2006.01)
　　*G06F 1/20*　　　(2006.01)

(52) U.S. Cl.
　　CPC ........... *H05K 7/20136* (2013.01); *G06F 1/20* (2013.01); *G06F 1/206* (2013.01); *H05K 7/2039* (2013.01)

(58) Field of Classification Search
　　CPC ............. H05K 7/20136; H05K 7/2039; H05K 5/0217; H05K 5/03; H05K 7/20145; G06F 1/20; G06F 1/206; G06F 1/203
　　See application file for complete search history.

(56) References Cited

U.S. PATENT DOCUMENTS

| | | | | |
|---|---|---|---|---|
| 10,423,200 | B1 * | 9/2019 | North | ..................... G06F 1/1616 |
| 11,758,685 | B2 * | 9/2023 | North | ................. H05K 7/20554 |
| | | | | 361/695 |
| 11,773,865 | B2 * | 10/2023 | He | ........................ F04D 29/329 |
| | | | | 361/679.48 |
| 2004/0174675 | A1 * | 9/2004 | Liu | ........................... G06F 1/20 |
| | | | | 361/679.48 |
| 2014/0313668 | A1 * | 10/2014 | Hsu | ....................... H05K 9/0028 |
| | | | | 361/709 |
| 2015/0049436 | A1 * | 2/2015 | Wu | .................... H05K 7/20163 |
| | | | | 361/697 |
| 2017/0199554 | A1 * | 7/2017 | Chen | ........................ H01L 23/38 |
| 2020/0396864 | A1 * | 12/2020 | Ku | ...................... H05K 7/20309 |
| 2022/0066523 | A1 * | 3/2022 | Wiltzius | ................... G06F 1/20 |

(Continued)

OTHER PUBLICATIONS

NGO, "Alienware x17 R1 RTX 3080 laptop review: A new beginning," NotebookCheck, Sep. 25, 2021, [https://www.notebookcheck.net/Alienware-x17-R1-RTX-3080-laptop-review-A-new-beginning.563108.0.html] retrieved on Sep. 21, 2022, 37 pages.

*Primary Examiner* — Stephen S Sul
(74) *Attorney, Agent, or Firm* — Hanley, Flight & Zimmerman, LLC

(57) ABSTRACT

Apparatus, systems, and methods are disclosed for cooling an electronic device. An example electronic device includes a chassis including a first cover and a second cover. The example electronic device also includes a first looped frame spaced apart from the first cover, a second looped frame spaced apart from the second cover, and a printed circuit board between the first looped frame and the second looped frame.

19 Claims, 5 Drawing Sheets

(56)  References Cited

U.S. PATENT DOCUMENTS

| 2022/0132705 A1* | 4/2022 | Langenfeld | ........ | H05K 7/20272 |
|---|---|---|---|---|
| 2022/0350378 A1* | 11/2022 | Grossmann | ........ | H05K 7/20172 |
| 2023/0189471 A1* | 6/2023 | Hashiba | ............. | H05K 7/20154 |
| | | | | 361/690 |
| 2023/0189472 A1* | 6/2023 | Wang | ................. | H05K 7/20409 |
| | | | | 361/695 |
| 2023/0328930 A1* | 10/2023 | Lin | ........................... | G06F 1/20 |
| | | | | 361/697 |
| 2023/0354554 A1* | 11/2023 | Lin | .................... | H05K 7/20172 |
| 2023/0368763 A1* | 11/2023 | Gossner | ................. | F16F 15/08 |

* cited by examiner

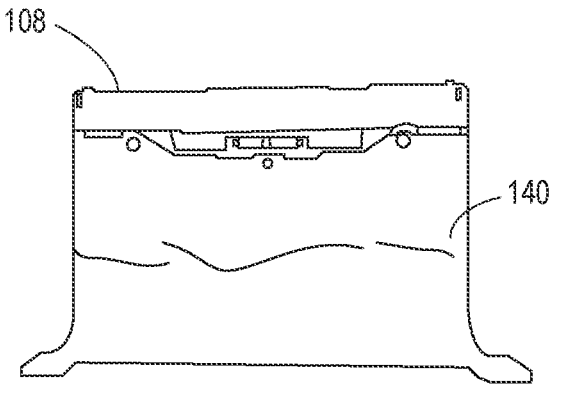
FIG. 4A
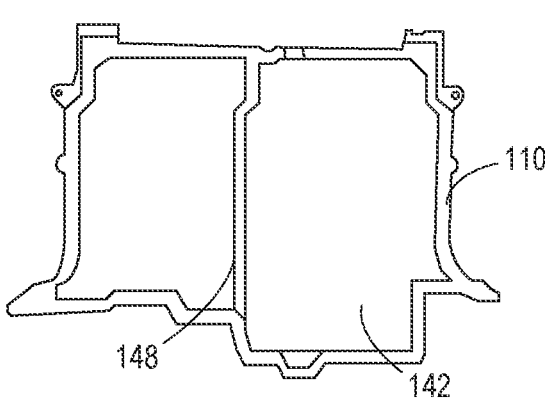
FIG. 5A
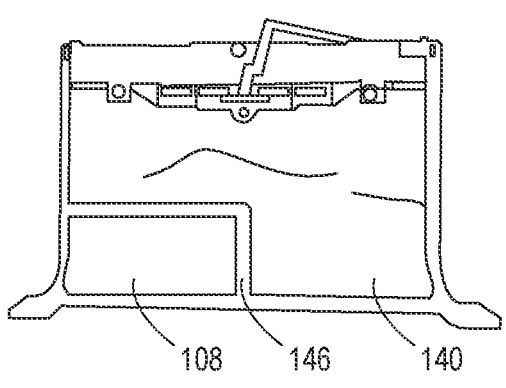
FIG. 4B
FIG. 5B

METHODS AND APPARATUS TO COOL ELECTRONIC DEVICES

FIELD OF THE DISCLOSURE

This disclosure relates generally to electronic devices and, more particularly, to methods and apparatus to cool electronic devices.

BACKGROUND

Electronic devices include heat generating components. Thermal management techniques are used to reduce the temperature of the skin of the electronic devices.

BRIEF DESCRIPTION OF THE DRAWINGS

FIG. 4A is top view of an example upper frame for an example cooling system for an example electronic device.

FIG. 4B is a bottom view of the example upper frame of FIG. 4A.

FIG. 5A is top view of an example lower frame for an example cooling system for an example electronic device.

FIG. 5B is a bottom view of the example lower frame of FIG. 5A.

In general, the same reference numbers will be used throughout the drawing(s) and accompanying written description to refer to the same or like parts. The figures are not to scale.

DETAILED DESCRIPTION

Figure 1:
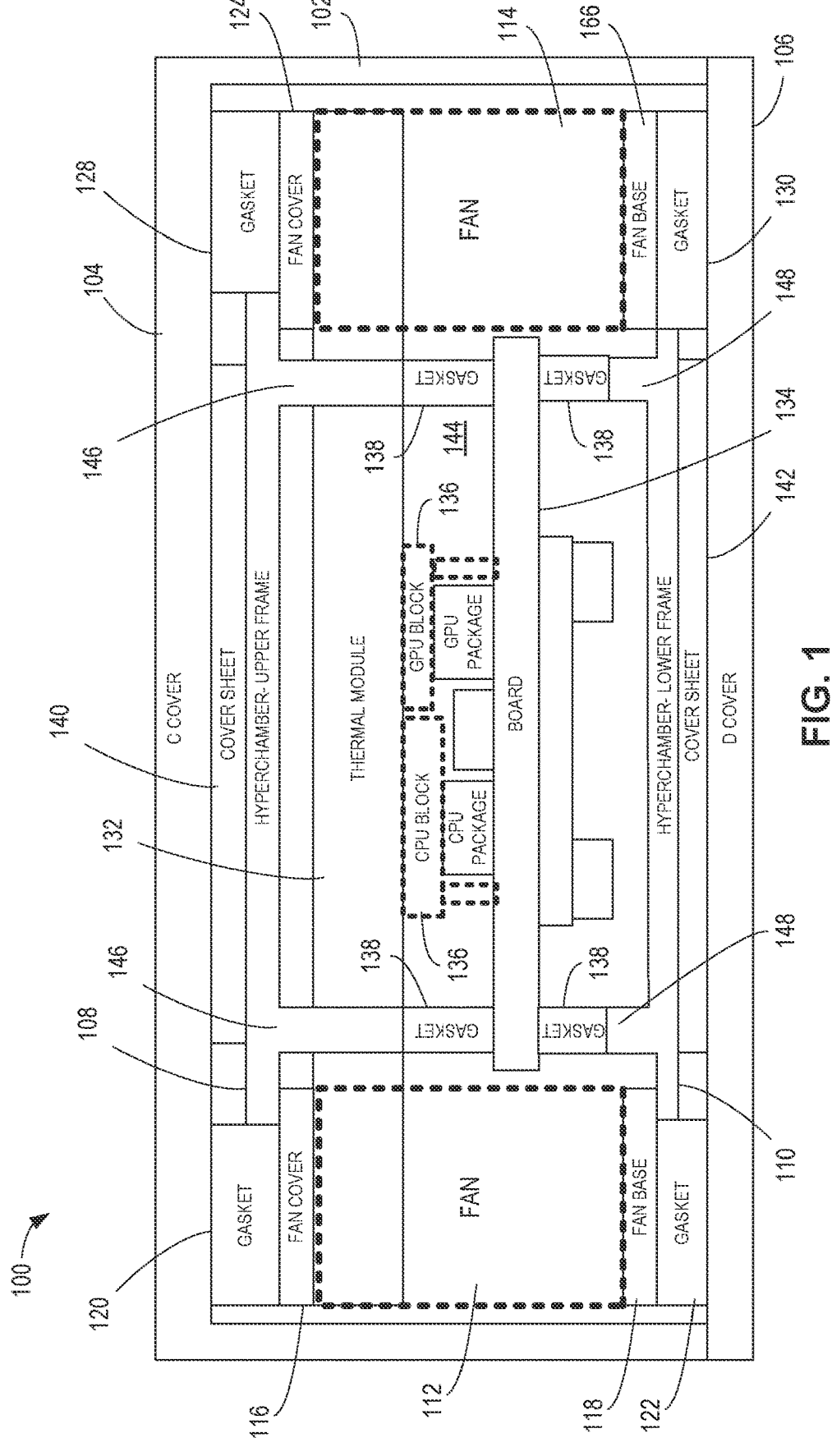
FIG. 1 is a cross-sectional schematic illustration of an example cooling system for an example electronic device.

Evacuative flow architecture is a common example thermal management technique used to reduce the skin temperature of electronic devices. Evacuative flow architecture includes fans that generate a sub-ambient pressure zone inside a chassis of the electronic device by creating a suction and then pushing the air through heat exchangers. The air passing through the heat exchanger cools heat pipe(s) and/or a vapor chamber, in turn reducing the skin temperature as well as junction temperatures of circuitry components of the electronic device. Junction temperature, or transistor junction temperature, is the typical highest operating temperature of a semiconductor in an electronic device.

Another example thermal management technique includes a hyperbaric flow architecture used to cool an electronic device. An example hyperbaric flow architecture includes one or more fans creating a suction of air into the electronic device, which creates a positively pressurized zone. The positively pressurized zone may be known as a hyperbaric chamber. The positive pressure pushes cooling air through a region of a printed circuit board (PCB) (e.g., the core region) and then through a heat exchanger such as, for example, a heat exchanger located at an edge of the electronic device.

Partitioning is used to create one or more hyperbaric chambers in an electronic device. Partitions include materials (e.g., sponges or other materials) that are attached to PCBs, fan covers, upper and/or lower chassis covers, heat pipes, and/or other components within an electronic device. The partitions are used for pressurizing and isolating the fan inlets/outlets.

There have been some challenges with respect to partitions used to create hyperbaric chambers that affect the thermal results of cooling systems that use hyperbaric chambers. For example, there may be leakages between partitions or bad partitioning for multiple reasons such as cables interfering with the partition materials (e.g., sponges), sponges being over-compressed and collapsing, and/or sponges not being properly aligned. In addition, there may be issues when the electronic devices with are mass produced, such as chassis deformation, sponges being improperly attached, mechanical structural and board component blockages, etc. Examples disclosed herein maintain the structural integrity of partitions and enhance the thermal results (e.g., cooling of the electronic device).

Throughout this disclosure, hyperbaric pressure, positive pressure, and super-ambient pressure may be used interchangeably to mean a pressure that is greater than the ambient pressure of the environment surrounding the electronic device. Negative pressure and sub-ambient pressure may be used interchangeably to mean a pressure that is lower than the ambient pressure of the environment surrounding the electronic device.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 1 is a cross-sectional schematic illustration of an example cooling system for an example electronic device 100. In the illustrated example, the electronic device 100 is a notebook or laptop computer. The examples disclosed herein may be implemented in other types of electronic devices. The electronic device 100 includes an example chassis 102. The chassis 102 includes an example first (e.g., upper or top) cover 104 and an example second (e.g., lower or base) cover 106.

With the chassis 102, the electronic device 100 include an example first (e.g., upper or top) looped frame 108 and an example second (e.g., lower or base) looped frame 110. As used herein, a "looped frame" is defined to mean a structure that forms an enclosed shape. Thus, a looped frame is not limited to a circularly shaped frame. A looped frame may be of any shape (e.g., a known shape, an irregular shape, etc.), have any number of sides, legs, curves, or elements, and/or include partitions creating subdivided areas within the frame.

In some examples, the first looped frame 108 is spaced from the first cover 104. In some examples, the second looped frame 110 is spaced from the second cover 106. In some examples, the first looped frame 108 and/or the second looped frame 110 include a plastic material. In some examples, the first looped frame 108 and/or the second looped frame 110 include one or more of an electrically conductive plastic, a magnesium or machined aluminum, and/or one or more micro heat pipes to have increased electromagnetic shielding properties. In some examples, the first looped frame 108 and/or the second looped frame 110 include one or more of a thermally conductive plastic, aluminum, and/or one micro heat pipes to provide increased thermal cooling properties.

The electronic device 100 includes an example first fan 112 and an example second fan 114. In some examples, there is only one fan. In some examples, the first fan 112 and/or the second fan 114 are dual outlet fans. Further details related to dual outlet fans are disclosed in U.S. patent application Ser. No. 17/848,583, which is hereby incorporated by reference in its entirety.

In the illustrated example, the first fan 112 includes an example first fan cover 116 and an example first fan base 118. The first looped frame 108 is coupled to the first fan cover 116 via an example first gasket 120. The second looped frame 110 is coupled to the first fan base 118 via an example second gasket 122. Likewise, the second fan 114 includes an example second fan cover 124 and an example second fan base 126. The first looped frame 108 is coupled to the second fan cover 124 via an example third gasket 128. The second looped frame 110 is coupled to the second fan base 126 via an example fourth gasket 128. In some examples, the one or more of the first gasket 130, the second gasket 122, the third gasket 128, and/or the fourth gasket 130 include one or more of an electrically conductive sponge, a rubber, and/or other material or combination of materials. In some examples, the first looped frame 108 and/or the second looped frame 110 are directly coupled to the respective first fan cover 116 or second fan cover 124 and/or the first fan base 118 or second fan base 126 directly without gaskets.

The electronic device 100 includes an example a thermal module 132. In some examples, the thermal module 132 include heat pipes, a vapor chamber, etc. The thermal module 132 is positioned between the first looped frame 108 and the second looped frame 110.

The electronic device 100 includes an example printed circuit board 134. Example electronic components 136 are coupled to the printed circuit board 134. Example electronic components 136 include, for example, heat generating components such as, for example, a CPU, a GPU, other processing circuitry and/or other electronic components. The printed circuit board 134 is coupled to the second looped frame 110 and at least one of the thermal module 132 or the first looped frame 108 via a plurality of example gaskets 138. The printed circuit board 134 is between the first looped frame 108 and the second looped frame 110. In some examples, the first looped frame 108 and the second looped frame 110 are spaced apart from the printed circuit board 134. The electronic components 136 including the CPU and/or the GPU also are positioned between the first looped frame 108 and the second looped frame 110.

The electronic device 100 also includes an example first cover sheet 140 over the first looped frame 108. The electronic device 100 also includes an example second cover sheet 142 over the second looped frame 110. In some examples the first cover sheet 140 and/or the second cover sheet 142 include polyethylene terephthalate (PET), PET mylar, and/or another plastic. In some examples, the first cover sheet 140 and/or the second cover sheet 142 include a graphite spreader to have increased electromagnetic shielding properties. In some examples, the graphite spreader is less than 0.2 mm thick. In some examples, the first cover sheet 140 and/or the second cover sheet 142 include a stamped sheet metal, an aluminum and/or copper foil, and/or a graphite spread to have increased thermal cooling properties. In some examples, the first cover 140 and/or the second cover 142 cover an entire space 144 including the hyperbaric chamber and one or both the first fan 112 and/or the second fan 114.

The first fan 112 and the second fan 114 force air into the space 144 between the first looped frame 108, the first cover sheet 140, the second looped frame 110, and the second cover sheet 142. The air causes the space 144 to be positively pressurized. Thus, the first fan 112 and the second fan 114 transform the space 144 into a hyperbaric chamber.

As disclosed herein, the first looped frame 108 and the second looped frame 110 sandwich the thermal module 132, the printed circuit board 134, and electronic components 136 therebetween. The air from the first fan 108 and the second fan 110 flows above the thermal module 132 to cool the skin of the first cover 104. The air from the first fan 108 and the second fan 110 flows into the space between the thermal module 132 and the printed circuit board 134 for cooling the electronic components 136. The air from the first fan 108 and the second fan 110 flows under the printed circuit board 134 for cooling the skin of the second cover 106. Because the first looped frame 108 is spaced from the first cover 104, and the second looped frame 110 is spaced from the second cover 106, the cooling of the skin of the first cover 104, the electronic components 136, and the skin of the second cover 106 operates effectively regardless of whether there are any deformations in the chassis 102. Any deformations in the chassis 102 will not intrude upon or otherwise compromise the functioning of the space 144 as a hyperbaric chamber.

Figure 2A:
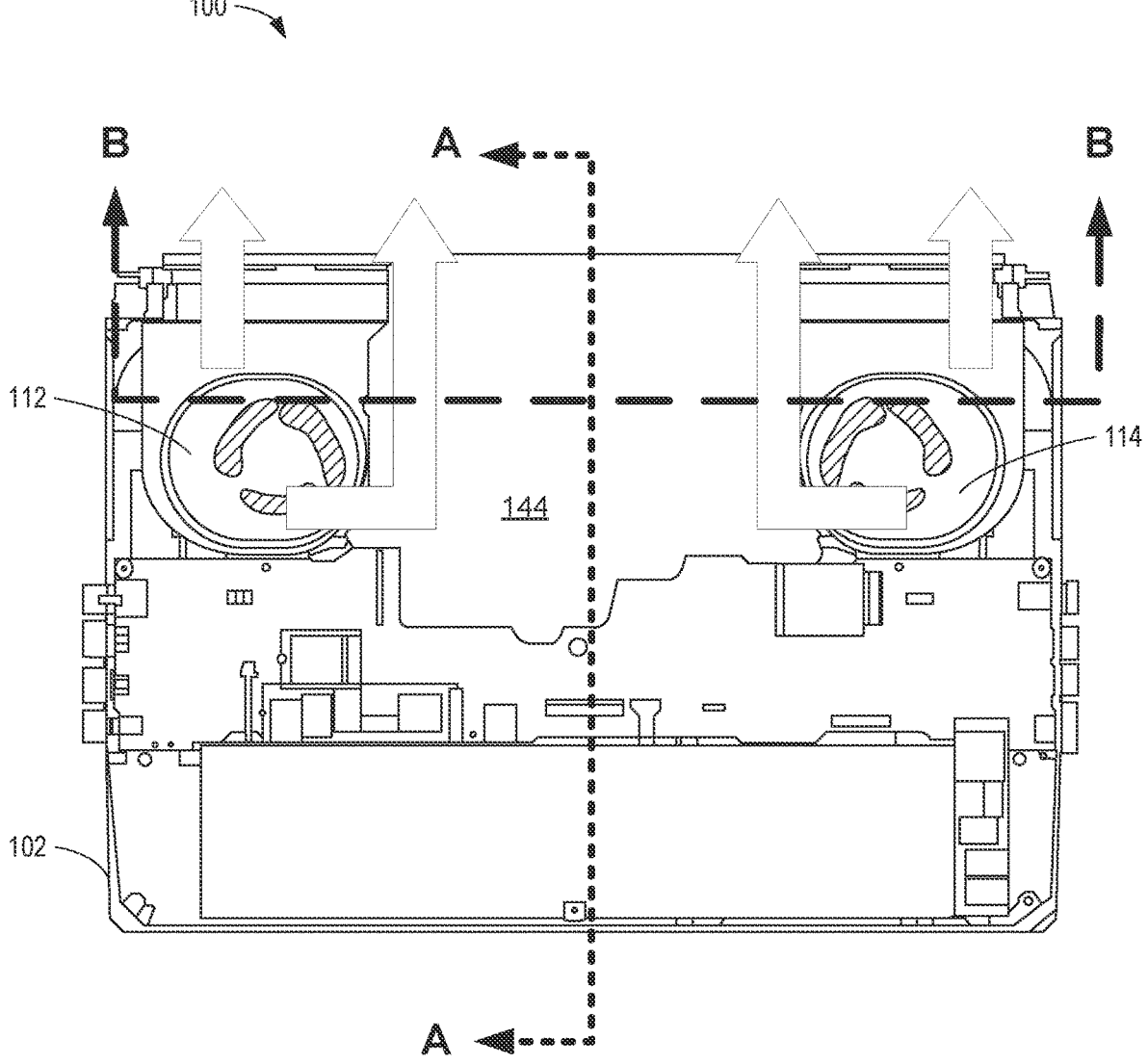
FIG. 2A is a top view of an example cooling system for an example electronic device.
Figures 2B, 2C:
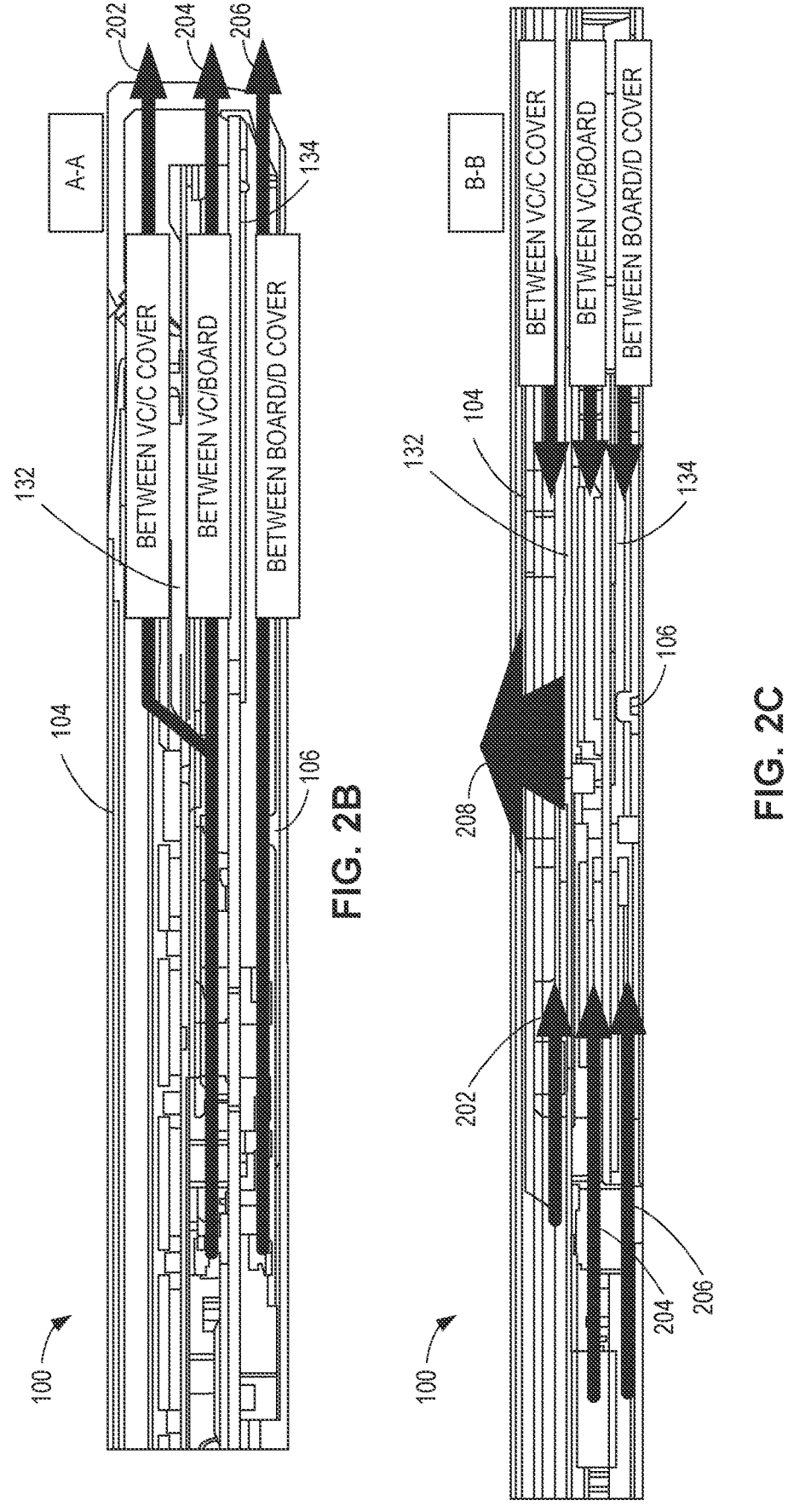
FIG. 2B is a cross-sectional view taken along line A-A of FIG. 2A.
FIG. 2C is a cross-sectional view taken along line B-B of FIG. 2A.

FIG. 2A is a top view of a portion of the electronic device 100 showing the flow of air from the first fan 112 and the second fan 114 to the exterior of the chassis 102. FIG. 2B is a cross-sectional view taken along the A-A line of FIG. 2A, and FIG. 2C is taken along the B-B line of FIG. 2A. FIGS. 2B and 2C show the flow of air from the first fan 112 and the second fan 114 on a top side of the thermal module 132 between the thermal module 132 and the first cover 104 to cool the first cover 104. This air flow is designated by arrow 202. FIGS. 2B and 2C show the flow of air from the first fan 112 and the second fan 114 between the thermal module 132 and the printed circuit board 134 to cool the electronic components 136. This air flow is designated by arrow 204. FIGS. 2B and 2C show the flow of air from the first fan 112 and the second fan 114 on a bottom side of the printed circuit board 134 between the printed circuit board 134 and the second cover 106 to cool the second cover 106. This air flow is designated by arrow 206. The flow of air around all components is then exhausted to the exterior of the chassis 102. This air flow is designated by arrow 208.

Figure 3:
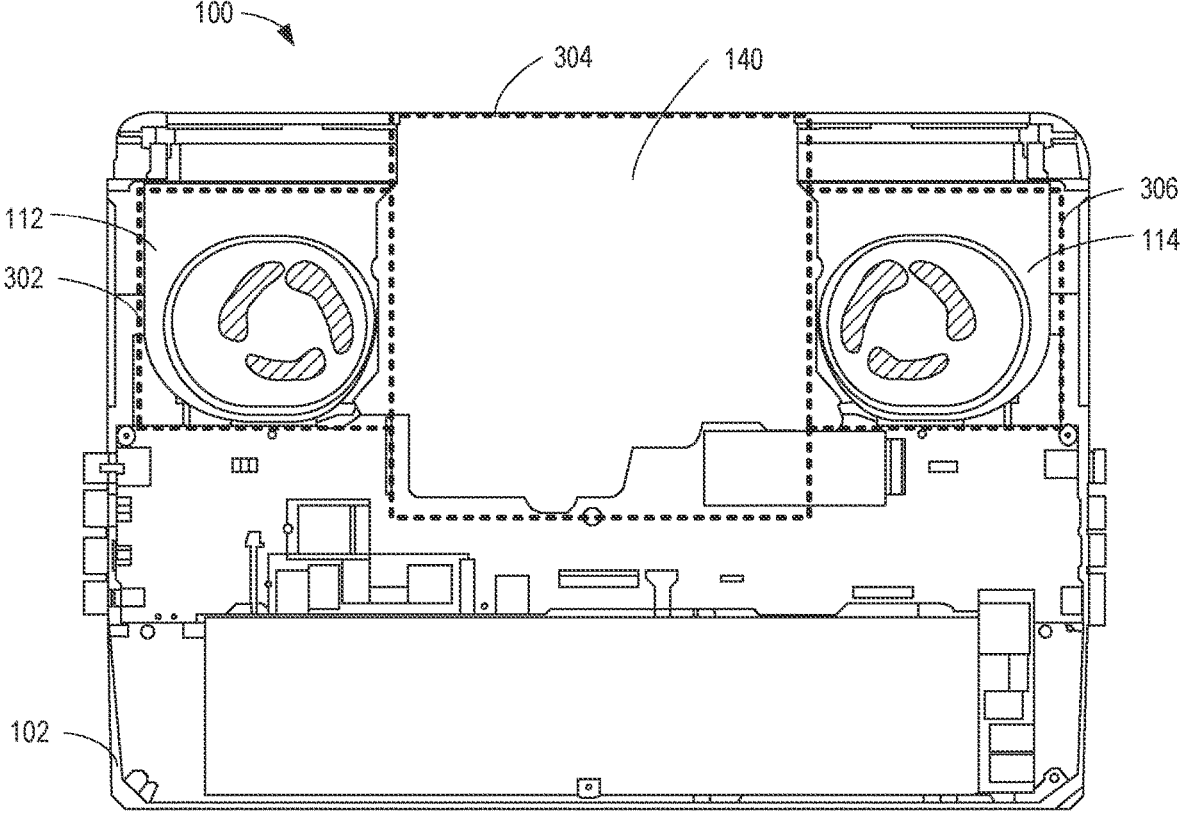
FIG. 3 is a top view of an example cooling system for an example electronic device.

In some examples, the first looped frame 108 includes one or more frame elements that act as a partition 146 (FIG. 1). In addition, in some examples, the second looped frame 110 includes one or more frame elements that act as a partition 148 (FIG. 1). The partitions 146, 148 may be used to create different sub-chambers within the first looped frame 108 and the second looped frame 110. For example, FIG. 3 shows a top view of a portion of the electronic device 100. In the example of FIG. 3, the first looped frame 108 is divided by the partitions 146 to create a first sub-chamber 302 above the first fan 122, a second sub-chamber 304 above the space 144 (covered by the first cover 140 in FIG. 3), and a third sub-chamber 306 above the second fan 114. In some examples, the partitions 148 create complementary sub-chambers with the second looped frame 110. In such examples, there is a fourth sub-chamber under the first fan 122, a fifth sub-chamber under the space 144, and a sixth sub-chamber under the second fan 114.

FIG. 4A is top view of the first looped frame 108 and first cover 140. FIG. 4B is a bottom view of the first looped frame 108 and first cover 140 showing the partitions 146. FIG. 5A is top view of the second looped frame 110 and second cover 142. FIG. 5B is a bottom view of the second looped frame 110 and second cover 142 showing the partitions 148.

In some examples, the electronic device includes means for creating a chamber or region of positive pressure. For example, the means for creating the chamber or region positive pressure may be implemented by one or more of the first fan 112, the second fan 114, the first looped frame 108, the second looped frame 110, and/or other structure disclosed herein. In some examples, the electronic device includes means for creating a negative pressure. For example, the means for creating the negative pressure may be implemented by the first fan 112, the second 114, and/or other structure disclosed herein.

From the foregoing, it will be appreciated that example systems, methods, apparatus, and articles of manufacture have been disclosed that cool electronic devices. In particular, examples disclosed herein cool the skin (e.g., outer covers) of electronic devices. Examples disclosed herein include hyperbaric architectures that create high pressurized areas inside a chassis to increase the flow of cooling air over a thermal module and electronic components coupled to a printed circuit board.

Examples disclosed herein have lower fan noise, better (e.g., cooler) skin temperature, and lower cost compared to conventional evacuative flow architecture.

Examples disclosed herein are immune from deformations in the covers of the chassis. Such deformations could cause sponges or gaskets that are used in conventional designs to become under-compressed (not touching the cover, printed circuit board, or other intended structure) or over-compressed (which increases air flow impedance in the interior volume of the chassis). This deficient compression of the sponges or gaskets compromises the sealing properties of the sponges and gaskets, which leads to leakage and/or insufficient air flow channels. The examples disclosed herein maintains the integrity of the seal around the hyperbaric chamber so the hyperbaric chamber remains positively pressurized.

In addition, attaching sponges on the printed circuit board and chassis is a concern of manufacturers due to probable human errors and manufacturing tolerances. The examples disclosed herein include two independent frames on both sides of the printed circuit board that eliminate the assembling and servicing issues due to inappropriate system/ device partitioning. Furthermore, attaching sponges and/or gaskets to a printed circuit board by operators is costly and inefficient. The examples disclosed herein can be manufactured automatically with high accuracy and tight tolerance, which saves cost and significantly improve the high volume manufacturing yield rate.

Example apparatus, systems, and methods for cooling an electronic device include Example 1, which is an electronic device comprising: a chassis including a first cover and a second cover; a first looped frame spaced apart from the first cover; a second looped frame spaced apart from the second cover; and a printed circuit board between the first looped frame and the second looped frame.

Example 2 includes the electronic device of Example 1, further including a thermal module between the first looped frame and the second looped frame.

Example 3 includes the electronic device of Examples 1 or 2, further including a first cover sheet adjacent the first looped frame.

Example 4 includes the electronic device of Example 3, further including a second cover sheet adjacent the second looped frame.

Example 5 includes the electronic device of Example 4, wherein the first cover sheet and the second cover sheet include a graphite spreader.

Example 6 includes the electronic device of any of Examples 1-5, wherein at least one of the first looped frame or the second looped frame includes an electrically conductive plastic.

Example 7 includes the electronic device of any of Examples 1-6, wherein at least one of the first looped frame or the second looped frame includes a thermally conductive material.

Example 8 includes the electronic device of any of Examples 1-7, wherein the first looped frame and the second looped frame are spaced apart from the printed circuit board.

Example 9 includes the electronic device of any of Examples 1-8, further including a CPU and a GPU positioned between the first looped frame and the second looped frame.

Example 10 includes the electronic device of any of Examples 1-9, further including a fan having a fan cover and a fan base, the first looped frame coupled to the fan cover, the second looped frame coupled to the fan base.

Example 11 includes the electronic device of Example 10, wherein the fan is a first fan, the fan cover is a first fan cover, the fan base is a first fan base, the electronic device including a second fan having a second fan cover and a second fan base, the first looped frame coupled to the second fan cover, and the second looped frame coupled to the second fan base.

Example 12 includes the electronic device of Example 11, wherein the first fan and the second fan are dual outlet fans.

Example 13 includes the electronic device of Example 12, wherein the first fan and the second fan force air into a space between the first looped frame and the second looped frame to create a positive pressure in the space.

Example 14 includes the electronic device of any of Examples 10-13, further including: a first gasket coupling the first looped frame to the fan cover; and a second gasket coupling the second looped frame to the fan base.

Example 15 includes an electronic device comprising: a chassis including a first cover and a second cover; a first looped frame spaced apart from the first cover; a second looped frame spaced apart from the second cover; and a dual outlet fan to force air into a space between the first looped frame and the second looped frame to create a positive pressure in the space.

Example 16 includes the electronic device of Example 15, further including a printed circuit board in the space.

Example 17 includes the electronic device of Example 16, further including a plurality of gaskets to couple the first looped frame and the second looped frame to the printed circuit board.

Example 18 includes the electronic device of Examples 16 or 17, wherein the dual outlet fan is a first dual outlet fan, the electronic device including a second dual outlet fan to force air into the space.

Example 19 includes the electronic device of any of examples 16-18, further including a thermal module in the space, the air to flow around a top side and a bottom side of the thermal module.

Example 20 includes the electronic device of any of Examples 16-19, wherein at least one of the first looped frame or the second looped frame includes a frame element to subdivide the space.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An electronic device comprising:
a chassis including a first cover and a second cover;
a first looped frame spaced apart from the first cover;
a second looped frame spaced apart from the second cover;
a printed circuit board between the first looped frame and the second looped frame; and
a CPU and a GPU between the first looped frame and the second looped frame.

2. The electronic device of claim 1, including a thermal module between the first looped frame and the second looped frame.

3. The electronic device of claim 1, including a first cover sheet adjacent the first looped frame.

4. The electronic device of claim 3, including a second cover sheet adjacent the second looped frame.

5. The electronic device of claim 4, wherein the first cover sheet and the second cover sheet include a graphite spreader.

6. The electronic device of claim 1, wherein at least one of the first looped frame or the second looped frame includes an electrically conductive plastic.

7. The electronic device of claim 1, wherein at least one of the first looped frame or the second looped frame includes a thermally conductive material.

8. The electronic device of claim 1, wherein the first looped frame and the second looped frame are spaced apart from the printed circuit board.

9. The electronic device of claim 1, including a fan having a fan cover and a fan base, the first looped frame coupled to the fan cover, the second looped frame coupled to the fan base.

10. The electronic device of claim 9, wherein the fan is a first fan, the fan cover is a first fan cover, the fan base is a first fan base, the electronic device including a second fan having a second fan cover and a second fan base, the first looped frame coupled to the second fan cover, and the second looped frame coupled to the second fan base.

11. The electronic device of claim 10, wherein the first fan and the second fan are dual outlet fans.

12. The electronic device of claim 1, including:

a first gasket coupling the first looped frame to the fan cover; and a second gasket coupling the second looped frame to the fan base.

13. An electronic device comprising:

a chassis including a first cover and a second cover;

a first looped frame spaced apart from the first cover;

a second looped frame spaced apart from the second cover;

a printed circuit board between the first looped frame and the second looped frame a first fan having a first fan cover and a first fan base, the first looped frame coupled to the first fan cover, the second looped frame coupled to the first fan base; and a second fan having a second fan cover and a second fan base, the first looped frame coupled to the second fan cover, and the second looped frame coupled to the second fan base, the first fan and the second fan are dual outlet fans, and the first fan and the second fan force air into a space between the first looped frame and the second looped frame to create a positive pressure in the space.

14. An electronic device comprising:

a chassis including a first cover and a second cover;

a first looped frame spaced apart from the first cover;

a second looped frame spaced apart from the second cover; and a dual outlet fan to force air into a space between the first looped frame and the second looped frame to create a positive pressure in the space.

15. The electronic device of claim 14, including a printed circuit board in the space.

16. The electronic device of claim 15, including a plurality of gaskets to couple the first looped frame and the second looped frame to the printed circuit board.

17. The electronic device of claim 15, wherein the dual outlet fan is a first dual outlet fan, the electronic device including a second dual outlet fan to force air into the space.

18. The electronic device of claim 15, including a thermal module in the space, the air to flow around a top side and a bottom side of the thermal module.

19. The electronic device of claim 15, wherein at least one of the first looped frame or the second looped frame includes a frame element to subdivide the space.

* * * * *